(12) United States Patent
Kilger

(10) Patent No.: US 9,704,843 B2
(45) Date of Patent: Jul. 11, 2017

(54) INTEGRATED SYSTEM AND METHOD OF MAKING THE INTEGRATED SYSTEM

(71) Applicant: Infineon Technologies AG, Neubiberg (DE)

(72) Inventor: Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/853,808

(22) Filed: Sep. 14, 2015

(65) Prior Publication Data

US 2016/0005728 A1 Jan. 7, 2016

Related U.S. Application Data

(62) Division of application No. 13/565,709, filed on Aug. 2, 2012, now Pat. No. 9,136,213.

(51) Int. Cl.
*H01L 21/78* (2006.01)
*H01L 25/00* (2006.01)
(Continued)

(52) U.S. Cl.
CPC ......... *H01L 25/50* (2013.01); *H01F 27/2804* (2013.01); *H01F 27/29* (2013.01); *H01L 21/32051* (2013.01); *H01L 21/56* (2013.01); *H01L 21/78* (2013.01); *H01L 23/49822* (2013.01); *H01L 23/5389* (2013.01); *H01L 23/645* (2013.01); *H01L 24/03* (2013.01);
(Continued)

(58) Field of Classification Search
CPC ......... H01L 21/00; H01L 21/02; H01L 21/30; H01L 21/44; H01L 21/48; H01L 21/50; H01L 21/52; H01L 21/54; H01L 21/58; H01L 21/60; H01L 21/66; H01L 21/78; H01L 21/82; H01L 23/02; H01L 23/28; H01L 23/30; H01L 23/34; H01L 23/36; H01L 23/48; H01L 23/50; H01L 23/52; H01L 25/50; H01L 25/65
USPC .... 438/3, 106, 107, 109; 257/678, 686, 666, 257/676, 737, 738, 777, 787; 29/601
See application file for complete search history.

(56) References Cited

U.S. PATENT DOCUMENTS 4,669,022 A 5/1987 Van Rooij
5,446,428 A 8/1995 Kumeji et al.
(Continued)

FOREIGN PATENT DOCUMENTS

CN 101197360 A 6/2008
CN 101232008 A 7/2008
(Continued)

*Primary Examiner* — Xiaoliang Chen
(74) *Attorney, Agent, or Firm* — Slater Matsil, LLP

(57) ABSTRACT

A system and method of manufacturing a system are disclosed. An embodiment of the system includes a first packaged component comprising a first component and a first redistribution layer (RDL) disposed on a first main surface of the first packaged component, wherein the first RDL includes first pads. The system further includes a second packaged component having a second component disposed at a first main surface of the second packaged component, the first main surface having second pads and a connection layer between the first packaged component and the second packaged component, wherein the connection layer connects a first plurality of the first pads with the second pads.

4 Claims, 12 Drawing Sheets

(51) Int. Cl.
| | |
|---|---|
| *H01L 23/498* | (2006.01) |
| *H01L 23/538* | (2006.01) |
| *H01L 25/10* | (2006.01) |
| *H01L 23/64* | (2006.01) |
| *H01L 23/00* | (2006.01) |
| *H01F 27/29* | (2006.01) |
| *H01L 21/3205* | (2006.01) |
| *H01L 25/065* | (2006.01) |
| *H01F 27/28* | (2006.01) |
| *H05K 1/16* | (2006.01) |
| *H05K 1/18* | (2006.01) |
| *H01L 21/56* | (2006.01) |

(52) U.S. Cl.
CPC .............. *H01L 24/05* (2013.01); *H01L 24/09* (2013.01); *H01L 24/20* (2013.01); *H01L 24/94* (2013.01); *H01L 24/96* (2013.01); *H01L 25/0657* (2013.01); *H01L 25/105* (2013.01); *H01F 2027/2809* (2013.01); *H01L 21/563* (2013.01); *H01L 23/49838* (2013.01); *H01L 24/11* (2013.01); *H01L 24/13* (2013.01); *H01L 24/16* (2013.01); *H01L 24/19* (2013.01); *H01L 24/40* (2013.01); *H01L 24/48* (2013.01); *H01L 24/81* (2013.01); *H01L 2224/0231* (2013.01); *H01L 2224/0237* (2013.01); *H01L 2224/0345* (2013.01); *H01L 2224/0361* (2013.01); *H01L 2224/0362* (2013.01); *H01L 2224/0381* (2013.01); *H01L 2224/0401* (2013.01); *H01L 2224/04042* (2013.01); *H01L 2224/04105* (2013.01); *H01L 2224/05073* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05184* (2013.01); *H01L 2224/05552* (2013.01); *H01L 2224/05639* (2013.01); *H01L 2224/05644* (2013.01); *H01L 2224/05647* (2013.01); *H01L 2224/05655* (2013.01); *H01L 2224/08145* (2013.01); *H01L 2224/11005* (2013.01); *H01L 2224/1132* (2013.01); *H01L 2224/1145* (2013.01); *H01L 2224/11312* (2013.01); *H01L 2224/11334* (2013.01); *H01L 2224/11462* (2013.01); *H01L 2224/11849* (2013.01); *H01L 2224/12105* (2013.01); *H01L 2224/131* (2013.01); *H01L 2224/13111* (2013.01); *H01L 2224/16145* (2013.01); *H01L 2224/16225* (2013.01); *H01L 2224/16227* (2013.01); *H01L 2224/16503* (2013.01); *H01L 2224/40227* (2013.01); *H01L 2224/45014* (2013.01); *H01L 2224/484* (2013.01); *H01L 2224/4847* (2013.01); *H01L 2224/48091* (2013.01); *H01L 2224/48137* (2013.01); *H01L 2224/48227* (2013.01); *H01L 2224/48463* (2013.01); *H01L 2224/73204* (2013.01); *H01L 2224/81801* (2013.01); *H01L 2224/82101* (2013.01); *H01L 2224/82106* (2013.01); *H01L 2224/96* (2013.01); *H01L 2225/1035* (2013.01); *H01L 2225/1041* (2013.01); *H01L 2924/00014* (2013.01); *H01L 2924/014* (2013.01); *H01L 2924/01322* (2013.01); *H01L 2924/1301* (2013.01); *H01L 2924/1305* (2013.01); *H01L 2924/13055* (2013.01); *H01L 2924/13091* (2013.01); *H01L 2924/1461* (2013.01); *H01L 2924/181* (2013.01); *H01L 2924/19107* (2013.01); *H05K 1/165* (2013.01); *H05K 1/181* (2013.01); *H05K 1/185* (2013.01); *Y10T 29/4913* (2015.01)

(56) References Cited

U.S. PATENT DOCUMENTS

| | | | |
|---|---|---|---|
| 6,378,774 B1 | 4/2002 | Emori et al. | |
| 6,414,856 B1* | 7/2002 | Ambatipudi | H02M 3/335 363/21.12 |
| 6,750,545 B1* | 6/2004 | Lee | H01L 23/49805 257/686 |
| 6,768,409 B2 | 7/2004 | Inoue et al. | |
| 7,180,318 B1 | 2/2007 | Mahoney et al. | |
| 7,230,309 B2 | 6/2007 | Bauer et al. | |
| 7,408,254 B1* | 8/2008 | Kim | H01L 21/561 257/686 |
| 7,605,476 B2* | 10/2009 | Gritti | H01L 25/0657 257/686 |
| 7,723,159 B2* | 5/2010 | Do | H01L 21/76898 257/E21.577 |
| 7,795,700 B2 | 9/2010 | Rofougaran | |
| 7,808,075 B1* | 10/2010 | Cheng | H01L 23/60 257/528 |
| 7,843,052 B1* | 11/2010 | Yoo | H01L 21/561 257/686 |
| 7,851,261 B2* | 12/2010 | Chai | H01L 21/565 257/686 |
| 8,039,304 B2* | 10/2011 | Pagaila | H01L 21/561 257/E21.705 |
| 8,093,104 B1* | 1/2012 | Lee | H01L 21/561 257/E21.499 |
| 8,217,492 B2 | 7/2012 | Rofougaran | |
| 8,338,929 B2* | 12/2012 | Chen | H01L 25/0657 257/678 |
| 8,564,091 B2 | 10/2013 | Sutardja | |
| 8,916,875 B2* | 12/2014 | Lee | H01L 23/49838 257/48 |
| 8,970,000 B2* | 3/2015 | Kerber | H01F 27/2804 257/528 |
| 2002/0105406 A1 | 8/2002 | Liu et al. | |
| 2002/0180025 A1* | 12/2002 | Miyata | H01L 25/0657 257/690 |
| 2004/0164385 A1* | 8/2004 | Kado | H01L 23/3128 257/678 |
| 2004/0241907 A1* | 12/2004 | Higashino | H01L 21/6835 438/109 |
| 2005/0012581 A1 | 1/2005 | Ono et al. | |
| 2005/0062166 A1* | 3/2005 | Kang | H01L 24/48 257/777 |
| 2005/0104168 A1* | 5/2005 | Choi | H01L 23/4334 257/666 |
| 2005/0263321 A1 | 12/2005 | Cheng et al. | |
| 2006/0249824 A1* | 11/2006 | Lee | H01L 24/97 257/678 |
| 2006/0284298 A1* | 12/2006 | Kim | H01L 25/0657 257/686 |
| 2007/0013081 A1* | 1/2007 | Lee | H01L 24/32 257/777 |
| 2007/0045796 A1* | 3/2007 | Ye | H01L 21/561 257/678 |
| 2007/0048969 A1* | 3/2007 | Kwon | H01L 21/76898 438/455 |
| 2007/0099341 A1* | 5/2007 | Lo | H01L 21/568 438/106 |
| 2007/0145548 A1* | 6/2007 | Park | H01L 21/6835 257/678 |
| 2007/0194427 A1 | 8/2007 | Choi et al. | |
| 2007/0229107 A1* | 10/2007 | Kim | H01L 24/33 257/777 |
| 2007/0246840 A1* | 10/2007 | Chye | H01L 25/0657 257/784 |
| 2007/0262436 A1* | 11/2007 | Kweon | H01L 21/561 257/686 |

(56) References Cited

U.S. PATENT DOCUMENTS

| | | | |
|---|---|---|---|
| 2007/0278657 A1* | 12/2007 | Lee | H01L 21/76898 257/692 |
| 2008/0012110 A1* | 1/2008 | Chong | H01L 23/13 257/686 |
| 2008/0096315 A1* | 4/2008 | Jeong | H01L 23/3114 438/109 |
| 2008/0128888 A1* | 6/2008 | Park | H01L 23/481 257/691 |
| 2008/0136002 A1* | 6/2008 | Yang | H01L 24/82 257/686 |
| 2008/0136004 A1* | 6/2008 | Yang | H01L 24/96 257/686 |
| 2008/0157316 A1* | 7/2008 | Yang | H01L 24/24 257/685 |
| 2008/0169546 A1* | 7/2008 | Kwon | H01L 21/561 257/686 |
| 2008/0179963 A1 | 7/2008 | Fouquet et al. | |
| 2008/0203552 A1* | 8/2008 | Kim | H01L 21/561 257/686 |
| 2008/0218799 A1* | 9/2008 | Hiew | G06F 1/1632 358/1.16 |
| 2008/0220565 A1* | 9/2008 | Hsu | G11C 5/02 438/109 |
| 2008/0272465 A1* | 11/2008 | Do | H01L 21/6835 257/620 |
| 2008/0272504 A1* | 11/2008 | Do | H01L 21/6836 257/797 |
| 2009/0001602 A1* | 1/2009 | Chung | H01L 24/94 257/777 |
| 2009/0014876 A1* | 1/2009 | Youn | H01L 21/6835 257/738 |
| 2009/0026600 A1* | 1/2009 | Koon | H01L 23/49861 257/686 |
| 2009/0032928 A1* | 2/2009 | Chiang | H01L 23/481 257/686 |
| 2009/0045489 A1* | 2/2009 | Koon | H01L 23/3107 257/666 |
| 2009/0174516 A1 | 7/2009 | Roc et al. | |
| 2009/0197372 A1* | 8/2009 | Han | H01L 21/6835 438/109 |
| 2009/0212390 A1 | 8/2009 | Rofougaran | |
| 2009/0218669 A1* | 9/2009 | Wang | H01L 21/6835 257/686 |
| 2010/0019391 A1 | 1/2010 | Strzalkowski | |
| 2010/0052120 A1 | 3/2010 | Pruitt | |
| 2010/0148910 A1 | 6/2010 | Takada | |
| 2010/0328902 A1 | 12/2010 | Ho et al. | |
| 2011/0023289 A1* | 2/2011 | Finn | G06K 19/07722 29/601 |
| 2011/0049693 A1 | 3/2011 | Nakashiba et al. | |
| 2011/0084380 A1 | 4/2011 | Kwon et al. | |
| 2011/0089530 A1 | 4/2011 | Strzalkowski | |
| 2011/0156233 A1* | 6/2011 | Kim | H01L 21/561 257/686 |
| 2011/0204472 A1* | 8/2011 | Pagaila | H01L 23/49822 257/528 |
| 2011/0241160 A1 | 10/2011 | Kerber et al. | |
| 2012/0002377 A1 | 1/2012 | French et al. | |
| 2012/0086125 A1* | 4/2012 | Kang | H01L 21/6835 257/738 |
| 2012/0112359 A1* | 5/2012 | Jeong | H01L 23/481 257/774 |
| 2012/0115277 A1* | 5/2012 | Lee | H01L 21/561 438/107 |
| 2012/0147578 A1 | 6/2012 | Jin et al. | |
| 2012/0168901 A1* | 7/2012 | Santangelo | H01L 23/48 257/531 |
| 2012/0181874 A1* | 7/2012 | Willkofer | H01L 23/48 307/104 |
| 2012/0193779 A1* | 8/2012 | Lee | H01L 23/3135 257/737 |
| 2012/0282735 A1* | 11/2012 | Ahn | H01L 21/76898 438/109 |
| 2012/0299170 A1* | 11/2012 | Kehrer | H01L 23/3107 257/673 |
| 2013/0008890 A1 | 1/2013 | Esaki et al. | |
| 2013/0052760 A1* | 2/2013 | Cho | H01L 22/14 438/15 |
| 2013/0082407 A1* | 4/2013 | Abbott | H01L 23/36 257/787 |
| 2013/0093088 A1* | 4/2013 | Chau | H01L 23/49517 257/738 |

FOREIGN PATENT DOCUMENTS

| | | |
|---|---|---|
| CN | 101944526 A | 1/2011 |
| CN | 102130510 A | 7/2011 |
| DE | 10346474 A1 | 5/2005 |
| DE | 102005043557 A1 | 9/2006 |
| DE | 102007059161 A1 | 6/2008 |

* cited by examiner

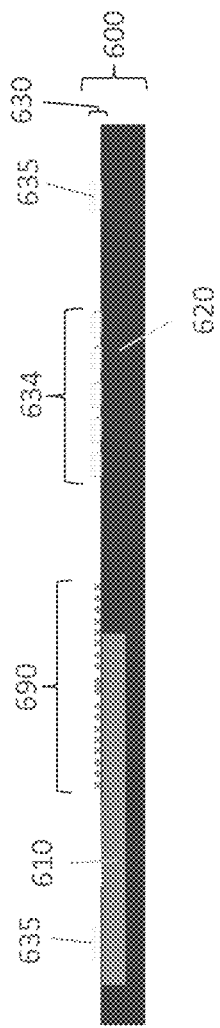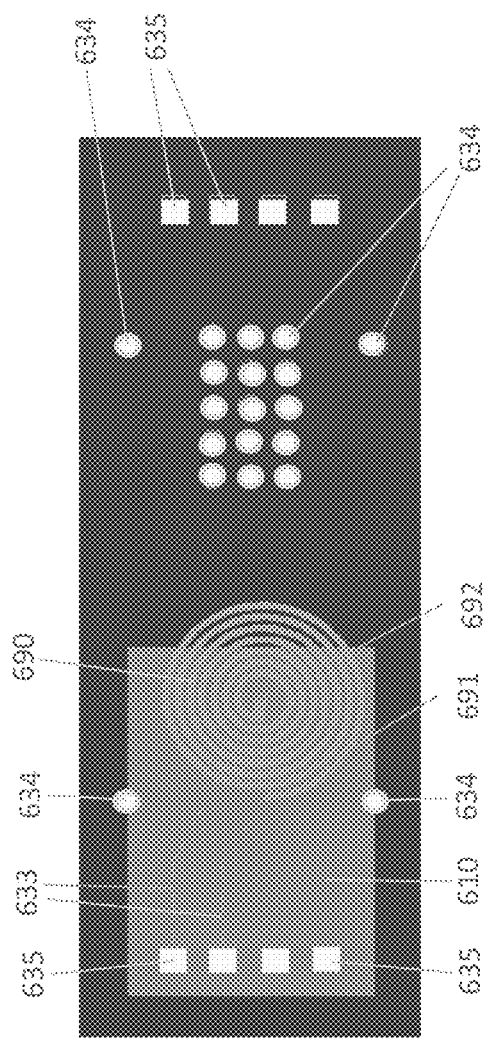
Figure 6a
Figure 6b

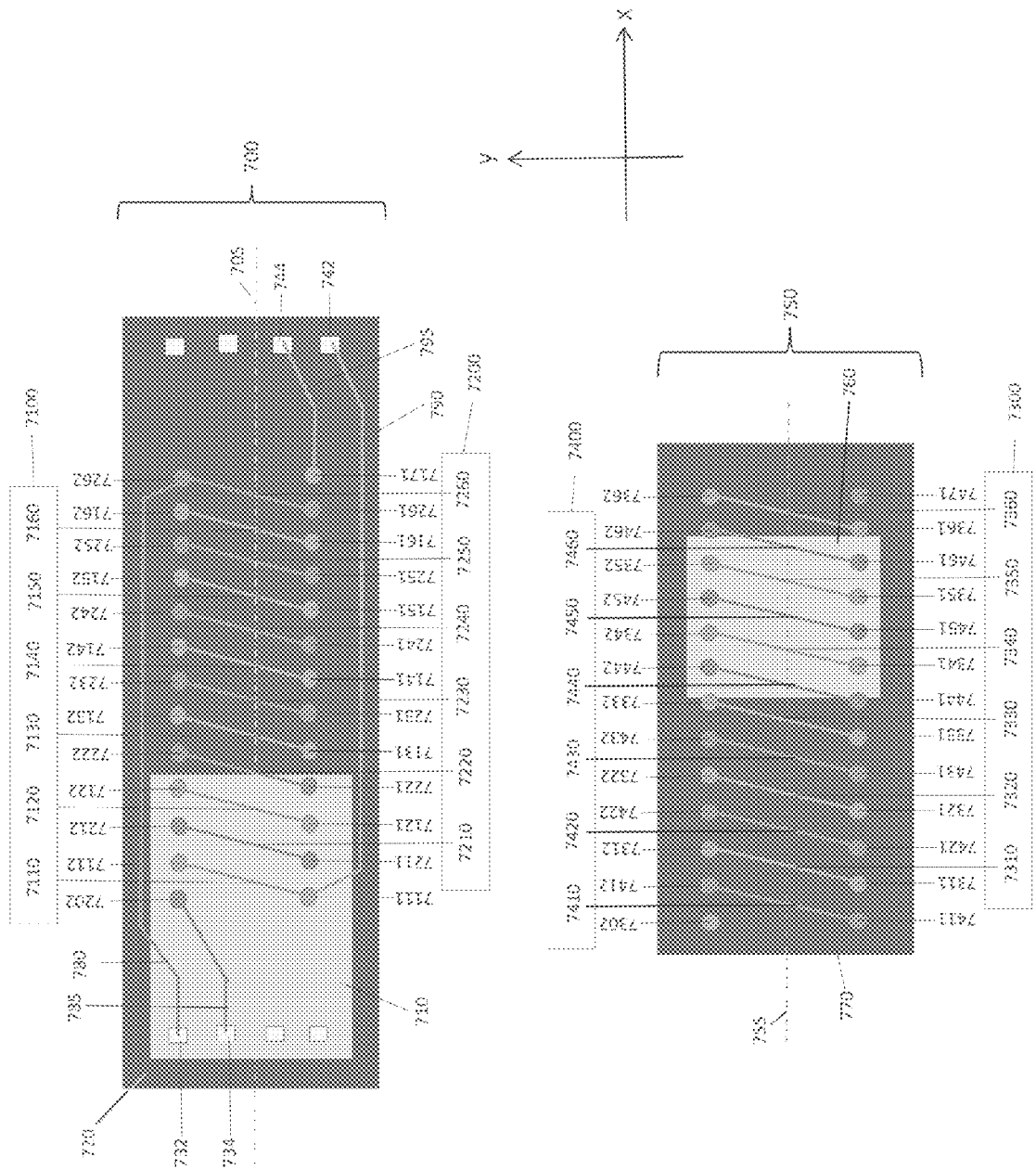

INTEGRATED SYSTEM AND METHOD OF MAKING THE INTEGRATED SYSTEM

This is a divisional application of U.S. application Ser. No. 13/565,709, issued on Sep. 15, 2015 as U.S. Pat. No. 9,136,213, entitled "Integrated System and Method of Making the Integrated System" which was filed on Aug. 2, 2012 and is incorporated herein by reference.

TECHNICAL FIELD

The present invention relates in general to packaging technology, and in particular to a method of manufacturing integrated devices based on a reconstitution wafer technology.

BACKGROUND

The consumer market demands for smaller, thinner, lighter and cheaper electronic devices with more diverse functionality and enhanced performance continues unabated. Chip-scale package (CSP) types and various versions of 3-dimensional (3D) integration of devices such as Silicon-on-Chip (SoC), Silicon-in-Package (SiP), or Package-on-Package (PoP) have been developed to minimize or further reduce package footprint. Wafer level packaging (WLP) techniques reduce manufacturing costs by extending wafer fab batch processes to include device interconnect formation and device protection processes. The shrinkage of pitches and pads at the chip-to-package interface has happened significantly faster than the shrinkage at the package-to-board interface, requiring larger-than-chip sized packages to provide sufficient area to accommodate an increasing number of second level interconnects. In consequence, so-called fan-out WLP (FO WLP) techniques have been developed to overcome limitations in interconnect count by chip size.

SUMMARY OF THE INVENTION

In accordance with an embodiment of the present invention, a system comprises a first packaged component comprising a first component and a first redistribution layer (RDL) disposed on a first main surface of the first packaged component, wherein the first RDL comprises first pads. The system further comprises a second packaged component comprising a second component disposed at a first main surface of the second packaged component, the first main surface comprising second pads and a connection layer between the first packaged component and the second packaged component, wherein the connection layer connects a first plurality of the first pads with the second pads.

In accordance with an embodiment of the present invention, a system comprises a first packaged component comprising a first semiconductor component, a second packaged component comprising a second semiconductor component and a transformer, wherein a first portion of the transformer is disposed in the first packaged component, and wherein a second portion of the transformer is disposed in the second packaged component. The system further comprises an underfill material disposed between the first packaged component and the second packaged component.

In accordance with an embodiment of the present invention, a method for manufacturing an apparatus comprises providing a first packaged component, the first packaged component comprising a first component and a first distribution layer (RDL), wherein the RDL is disposed on a first main surface of the first packaged component and providing a second packaged component, the second packaged component comprising a second component, wherein the second component is disposed at a first main surface of the second package component. The method further comprises connecting face to face the first main surface of the first packaged component to the first main surface of the second packaged component.

In accordance with an embodiment of the present invention, a method for manufacturing a device comprises forming a first reconstitution wafer comprising a first component and forming a second reconstitution wafer comprising a second component. The method further comprising dicing the second reconstitution wafer into a second packaged component, the second packaged component comprising the second component, placing the second packaged component on a first main surface of the first reconstitution wafer; and dicing the second reconstitution wafer into the device, the device comprising the first component and the second packaged component.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6a-6e show an embodiment of a core-less or a core based transformer;

FIGS. 7a-7d show an embodiment of a core-less or a core based transformer; and

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Over time various techniques of stacking devices on top of each other have been developed in order to gain a significant reduction of footprint as compared to the side-by-side assembly of electric components on a printed circuit board. Known approaches are, for example, the stacking of a smaller wire bond compatible (WB) chip on top of a larger WB chip (WB-WB stack), the attachment of a WB chip on top of a flip chip (FC-WB stack), the stacking of a smaller flip chip on top of a suitably modified wire bond compatible chip (WB-FC stack), or the package-on-package (PoP)

approach. All these approaches are limited in the flexibility where the bond pads can be placed.

Embodiments of the present invention provide bond pad placement methods in which the bond pads can be placed to locations other than those of the traditional approach. For example, integrated packaged devices may comprise extended chip packages with extended bond pads disposed thereon.

Figure 1A:
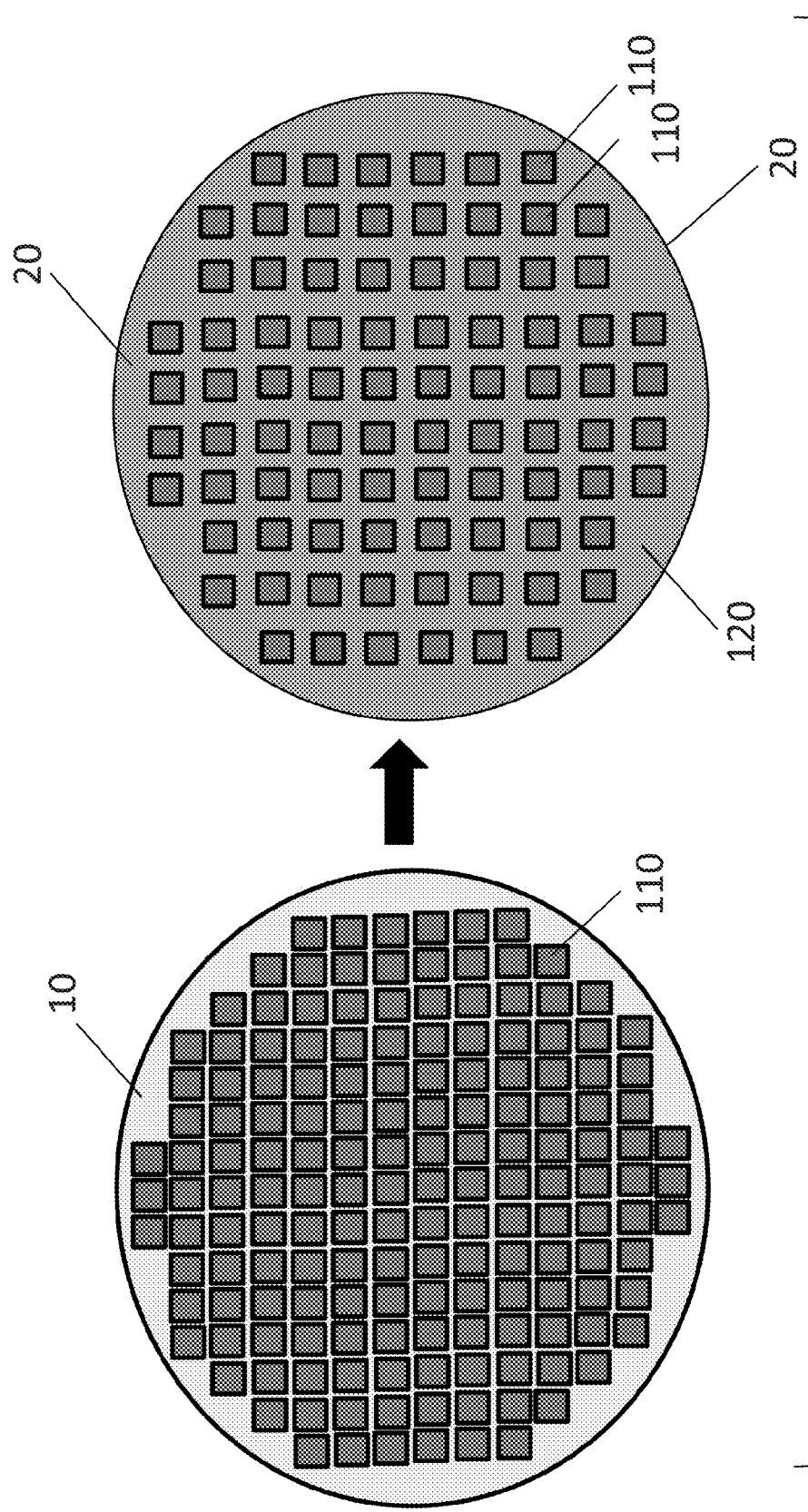
FIG. 1a illustrates the principle of chip embedding technology.
Figure 1B:
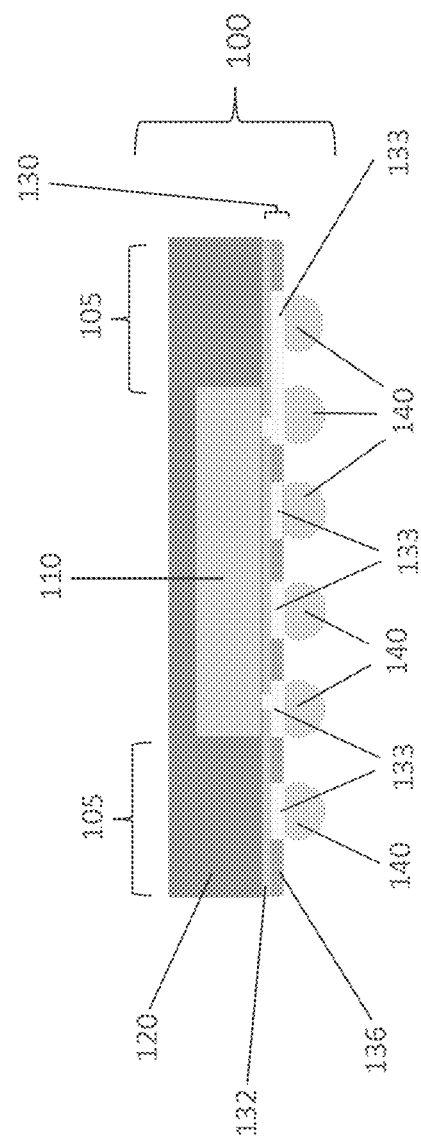
FIG. 1b illustrates a cross-sectional view of a singulated chip embedding technology package.

Embodiments of the present invention can be realized by utilizing a chip embedding technology. For example, the chip embedding technology may be an embedded wafer level process or an embedded wafer level ball grid array (eWLB) technology. The chip embedding method is a fan-out wafer level packaging WLP type technique which allows manufacturing components not limited by the chip size. The package may not be realized on a silicon wafer, as with traditional WLP processing, but on an artificial wafer termed a reconstituted or reconstitution wafer. The transition from a processed Si wafer 10 to a reconstitution wafer 20 during the initial stages of the chip embedding process flow is illustrated schematically in FIGS. 1a and 1b.

Known good dies 110 from a silicon wafer 10 produced in a conventional front-end-process flow are picked and placed on a wafer-shaped carrier covered with an adhesive foil. The dies 110 are oriented with their active side facing the carrier surface. The freely adjustable distance between adjacent dies 110 on the carrier determines the size of fan-out areas 105 around the dies 110 and is chosen in a manner to provide the number of interconnects. The gaps between the placed dies 110 are filled with molding material 120 (e.g. polyimide, epoxy resins, polysulfone compounds) using a compression molding process for example. Then the molding compound is cured (e.g., at 250° C.). Subsequently a redistribution layer 130 is structured on top of the reconstituted wafer 20 by a process sequence involving deposition of a dielectric 132, sputtering of a seed layer, application and structuring of plating resist, electroplating of redistribution lines and landing pads 133, resist strip, seed layer etch, and application and structuring of a solder stop layer 136. Solder ball 140 application, testing/inspection at wafer level, backside marking and finally dicing of the reconstituted wafer 20 follow.

Figure 2:
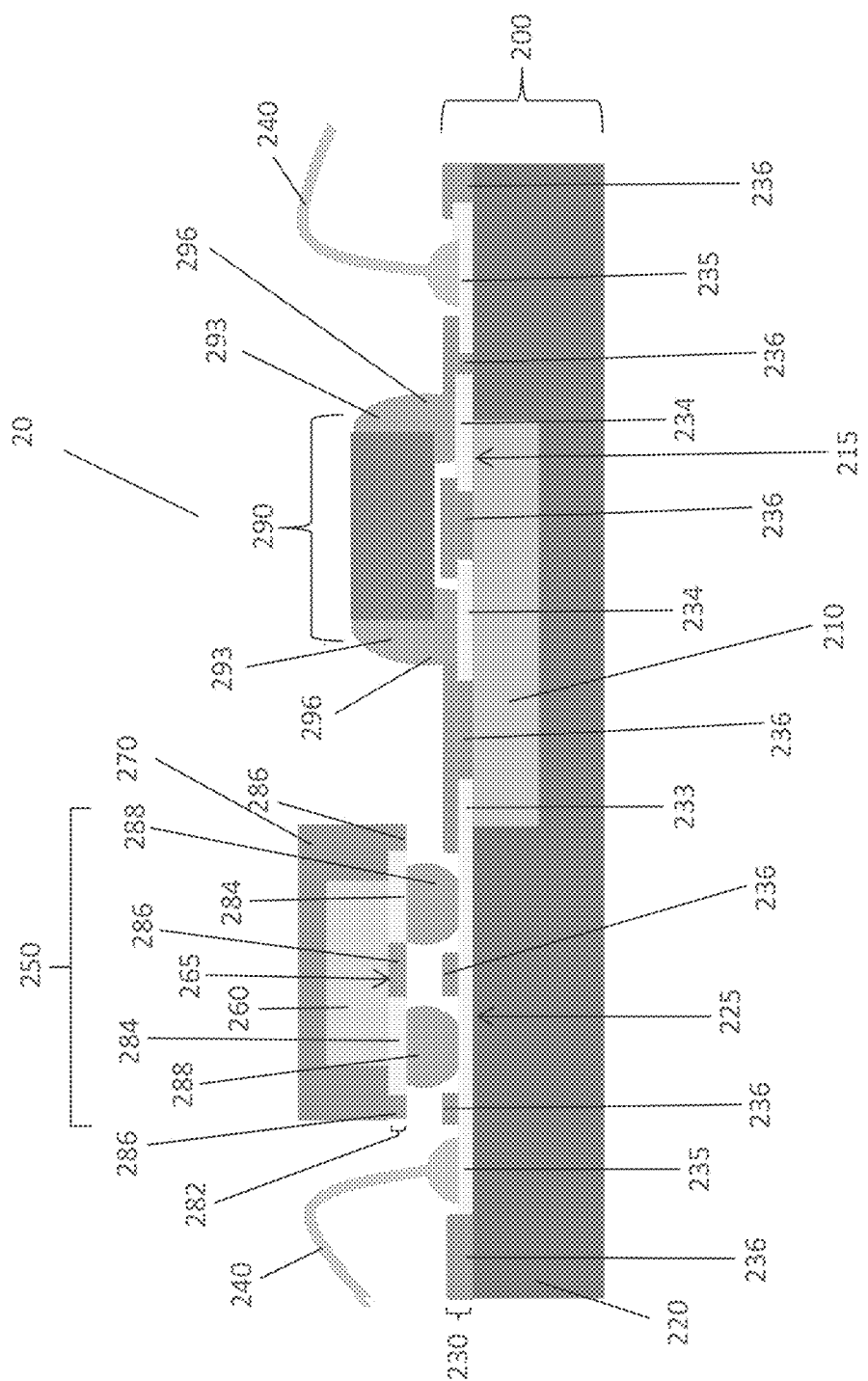
FIG. 2 illustrates a cross-sectional view of an embodiment of an integrated device.

A first embodiment is illustrated in FIG. 2, showing in schematic cross-sectional view the architecture of an exemplary integrated system 20 comprising three packaged components 200, 250, 290.

The first packaged component 200 is build according to a chip embedding process flow such as a eWLB process flow. The first packaged component 200 comprises a first component 210 embedded in a layer of encapsulation material 220. The first packaged component 200 further comprises a first redistribution layer (RDL) 230 which is disposed on a first main surface 215 of the first packaged component 200. The first RDL 230 may be disposed outside the first component 210. The first RDL 230 comprises conductive interconnect lines 233 and landing pads 235, and electrically insulating portions 236.

The integrated system 20 further comprises a second packaged component 250 and a third packaged component 290. The second packaged component 250 may be a chip-scale WLP package. Alternatively, the second packaged component 250 may be a chip embedding process package such as eWLB package or a WLB package. The second packaged component 250 comprises a second component 260 embedded in a second encapsulation material 270. The second component 260 may be disposed at a first main surface 265 of the second packaged component 250. Further, the second packaged component 250 may comprise a second RDL 282 having conductive traces, bond pads 284 and electrically insulating portions 286. The second packaged component 250 may be soldered to the first packaged component 200 through a ball grid array (BGA) of solder balls 288. Alternatively, the second package component 250 may be attached to the first package component 200 by a layer of solder paste or by an area array of copper pillars/studs.

The third packaged component 290 may be a surface mount device (SMD). The surface mount device may be an active component, a passive component or an electromechanical component (MEMS). For example, the SMD may be a diode, a resistor, a capacitor, a transducer such as a MEMS microphone. The SMD may comprise caps 293 (e.g., tin caps) which may be electrically connected by solder material 296 to landing pads 234 of the first redistribution layer 230.

The first component 210 and the second component 260 comprise a substrate. The substrate may be a semiconductor substrate such as silicon or germanium, or a compound substrate such as SiGe, GaAs, InP, GaN or SiC, or alternatively, other materials. The substrate may be doped or undoped and may comprise one or more wells. The semiconductor substrate may be a single crystal silicon or a silicon-on insulator (SOI). One or more interconnect metallization layers may be arranged on the substrate. A passivation layer is disposed on the interconnect metallization layers to electrical isolate and structure component contact pads for the components.

The first component 210 and the second component 260 may comprise a plurality of components (e.g., chips or dies). The components 210, 260 may comprise a discrete device such as a single semiconductor device or an integrated circuit (IC). For example, the components 210, 260 may comprise a semiconductor device such as a MOSFET or a power semiconductor device such as a bipolar transistor, an insulated gate bipolar transistor (IGBT), a power MOSFET, a thyristor or a diode. Alternatively, the components 210, 260 may be a resistor, a protective device, a capacitor, a sensor or a detector, for example. The components 210, 260 may be a system on chip (SoC). In one embodiment the components 210, 260 comprise a single device such as a transistor, wherein the top surface comprises a source and the bottom surface comprises a drain.

The first encapsulation material 220 and the second encapsulation material 270 may comprise a molding compound, a laminate or a casing. The encapsulation material may comprise thermosetting materials such as epoxy, polyimide, polyurethane or polyacrylate compounds. Alternatively the encapsulation material may comprise thermoplastic materials such as polysulfones, polyphenylene sulfides, or polyetherimides. In one embodiment the encapsulation material may be a laminate such as a prepreg.

The integrated system 20 may be bonded via a wire 240 to a carrier. The wire 240 is attached to bond pads 235 disposed on the first RDL at the periphery of the first packaged component 200. The wire 240 may be bonded to the carrier via ball bonding, wedge bonding, strip bonding or ribbon bonding. Alternatively, the integrated system 20 is connected to the carrier through a conductive clip. The integrated system 20 may be encapsulated with an encapsulation material (not shown).

In one embodiment the integrated system 20 may be a QFP (quad flat package) having several packaged components integrated therein. Alternatively, the integrated system 20 may be an integrated package including several smaller SMDs (e.g. resistors, capacitors, or diodes) disposed on a PCB.

Figure 3:
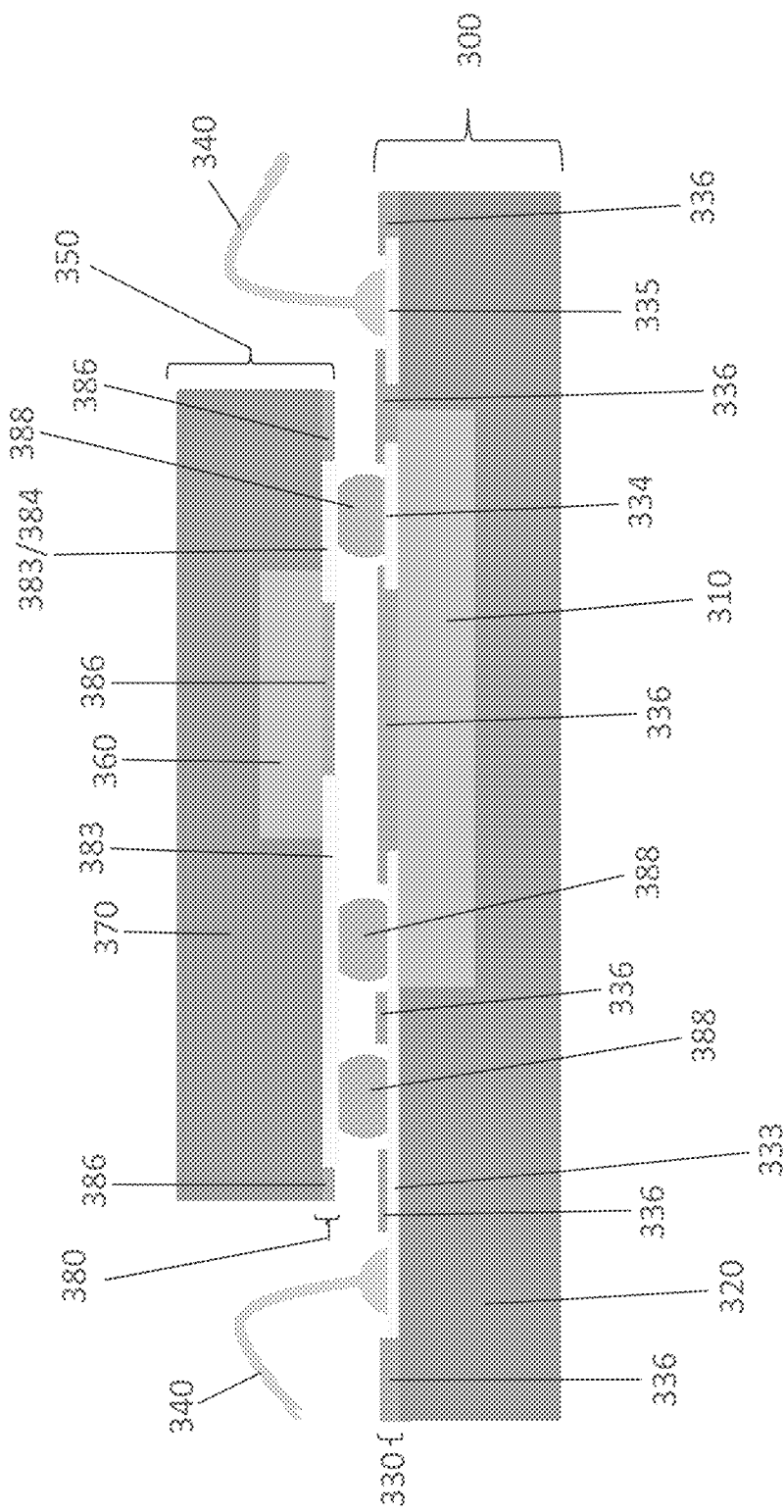
FIG. 3 illustrates a cross-sectional view of an embodiment of an integrated device.

A further embodiment of an integrated system 30 is illustrated in FIG. 3. The integrated system 30 comprises a first packaged component 300 and a second packaged component 350, wherein both packaged components 300/350 have been built by applying a chip embedding technology. The elements of the mother package 300 correspond to those of the mother package 200 and the elements of the daughter package 350 correspond to those of the daughter package shown in FIG. 2.

The second packaged component 350 comprises a second component 360 embedded in second encapsulation material 370. The second packaged component 350 further comprises a second RDL 380 having conductive 383 and non-conductive 386 portions. The second packaged component 350 may be electrically connected to the first packaged component 300 via an array grid of solder balls 388. The chip embedding process/chip embedding process stack includes two redistribution layers 330/380 providing increased design flexibility. The two redistribution layers 330/380 disposed in a chip embedding process/chip embedding process package stack exhibit functionality equivalent to that of a two-layer RDL. For example, the eWLB/eWLB stack can be designed with crossing conductive lines or crossing interconnect traces. In one embodiment the integrated system 30 may be packaged forming a module such as a VQFN package (very thin quad flat non-lead package).

Figure 4:
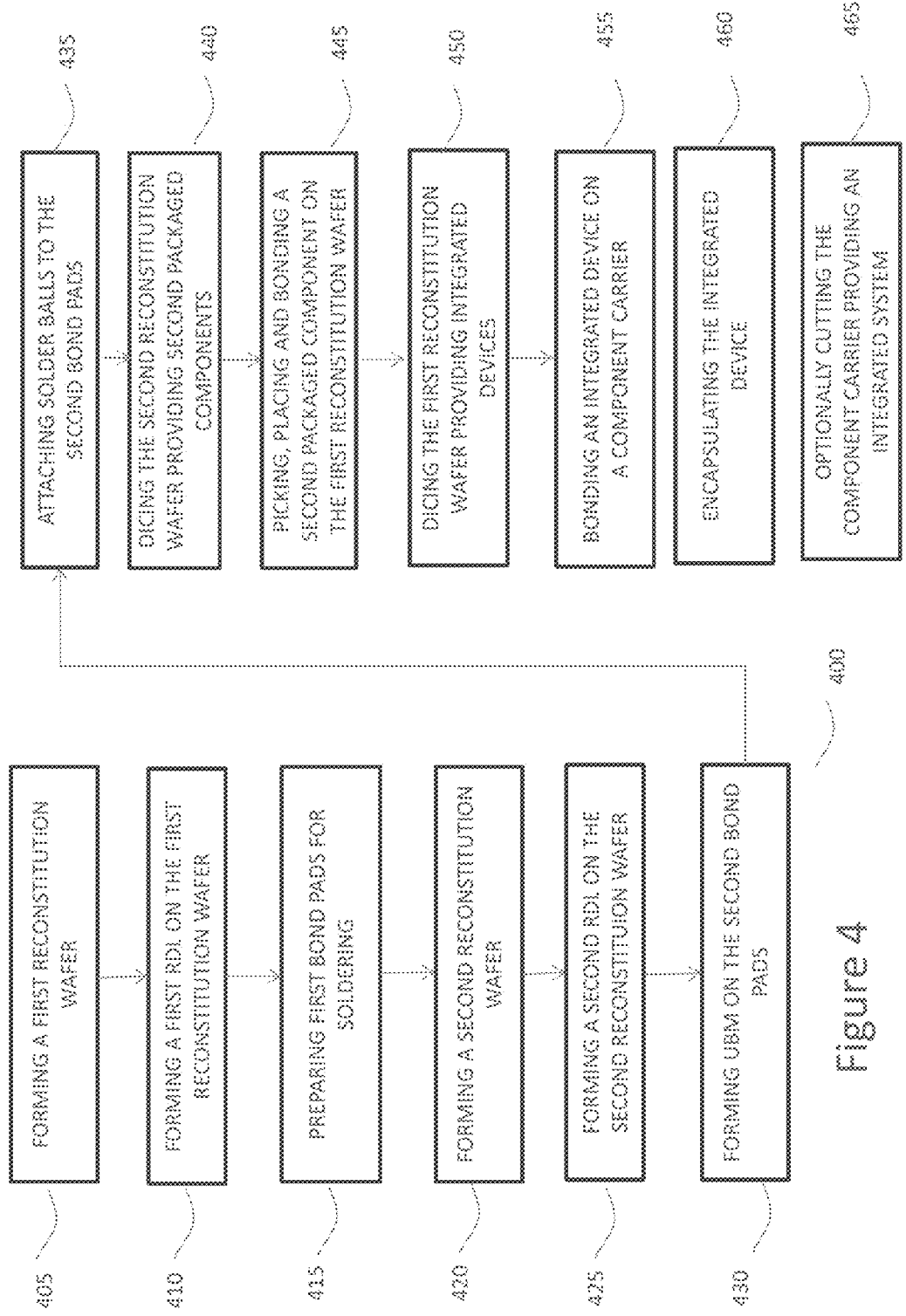
FIG. 4 shows a process flow of an embodiment of a method for manufacturing an integrated device.

FIG. 4 shows a flow chart 400 of an embodiment to manufacture a semiconductor system. The first reconstitution wafer may be manufactured using a chip embedding technology. In a first step 405 a first reconstitution wafer is formed. The first reconstitution wafer comprises diced first components and a first encapsulation material as described with respect to FIGS. 1a and 1b. In step 410, a first redistribution layer (RDL) is formed on the first reconstitution wafer. The first RDL may be formed by first depositing an insulating layer, patterning and etching the insulating layer, and then depositing a conductive material in the patterned insulation layer. The patterned conductive material in the RDL provides interconnect traces for connecting the first component with bond pads in fan out areas. The insulating material of the RDL may comprise polyimide, silicon nitride or silicon oxide or a combination thereof. The patterned conductive material of the RDL may comprise Cu or Al.

In step 415 the bond pads are prepared for solder application occurring at a later stage of the overall process sequence. The pad surfaces may be covered with a stack of thin metallic films of suitable composition providing optimum conditions for the formation of strong and reliable solder bonds. For example, a surface finish stack may comprise gold (Au) (e.g., about 0.5 µm to about 2 µm) on plated nickel (Ni) (e.g., about 2.5 µm to about 4 µm). The thin Au top layer may prevent oxidative degradation of Ni and preserves the solderability of Ni. Ni on the other hand facilitates the formation of intermetallics (e.g., Ni/Sn) to form strong metallurgical bonds.

In step 420, a second reconstitution wafer is formed. The second reconstitution wafer may be manufactured using a chip embedding technology. The second reconstitution wafer comprises diced second components and a second encapsulation material as described with respect to FIGS. 1a and 1b. The second component and the second encapsulation material may be the same or different than the first component and the first encapsulation material. In step 425, a second RDL is formed on the second reconstitution wafer. The second RDL may be formed by first depositing an insulating layer, patterning and etching the insulating layer, and then depositing a conductive material in the patterned insulation layer. The patterned conductive material in the second RDL provides interconnect traces for connecting the first component with bond pads in fan out areas. The insulating material of the second RDL may comprise polyimide, silicon nitride or silicon oxide or a combination thereof. The patterned conductive material of the second RDL may comprise Cu or Al. The materials of the second RDL may be the same or different than the materials of the first RDL. In one embodiment, an array of bond pads may be formed in the second RDL, the array of bond pads are configured to receive solder balls of a ball grid array (BGA).

In step 430, an under-bump metallization (UBM) layers may be deposited over the bond pads. The UBM metallurgy may provide good adhesion to the chip passivation layer surrounding the bond pads and may provide a low osmic resistance to the final interconnect (solder ball) metallurgy. Several UBM material choices are available such as Al/Ni/Cu, electroless Ni/Au, Ni/Cu/Au, Cr/Cu/Ag or Ti/W/Cu. The total UBM process sequence involves RF Ar sputter cleaning of the pad surface, UBM sputter deposition, patterning of photoresist, etching of UBM in areas not covered by photoresist, etching of the UBM, and stripping of the resist to expose the UBM.

In step 435, solder balls may be attached to the second solder pads using a solder bumping process or a ball apply process. Solder bumping process options include solder paste printing, sputter deposition or electroplating of alloy components in an appropriate ratio, thermosonic bonding, or application of an ink jet process to dispense molten and pressurized solder material. Materials employed for solder ball formation may be eutectic Sn/Pb, or Pb-free Sn/Ag/Cu or Sn/Bi. The ball apply process may comprise applying preformed solder balls (e.g. using a stencil) on a flux depot and reflow soldering.

In the next step 440, the second reconstitution wafer is diced into a plurality of second packaged components. The second packaged components are picked & placed onto the first reconstitution wafer. Then the first reconstituted wafer and the second packaged components are bonded together (step 445).

After the bonding gaps between the top surface of a first reconstituted wafer and second component packages may be filled with an insulation material. The insulation material may be an underfill material. Typical underfill materials are epoxy, silicone, or urethane based materials. Then the first reconstitution wafer is diced forming integrated devices comprising a first component package with one or more second component packages disposed thereon (step 450).

In step 455 the integrated devices are placed on a component carrier. The component carrier may be a lead frame, a substrate or a board such as a printed circuit board (PCB). The integrated devices are bonded to the component carrier. For example, the integrated devices are wire bonded, ball bonded, wedge bonded, ribbon bonded or a combination of these bonding processes. Alternatively, the integrated devices may be connected to the component carrier using a conductive clip.

In step 460 the integrated device is encapsulated and the component carrier is optionally cut or separated (step 465). The encapsulation material may be the same as or different from the encapsulation materials discussed with respect to FIG. 2.

The integration approaches disclosed in the embodiments of the present invention offers high flexibility in applications, allowing interconnection of a wide variety of different device types such as semiconductor chips (e.g. logic or volatile or non-volatile memory devices), passive components (e.g. resistors, inductors, capacitor, receivers, transceivers), MEMS devices, or devices of other functionality.

The embodiment of the manufacturing process provide several advantages: Both mother package and overlying daughter package(s) may be tested separately using standard test equipment prior to the bonding of overlying packages to the first reconstituted wafer. In case overlying daughter packages are directly surface-mounted to a mother package via BGA soldering or application of other solder joints, pasting of an overlying package to a carrier package is not required. Thus any contamination of the mother package by the used adhesive material can be avoided.

A further embodiment of the invention relates to coreless transformers. Coreless transformer provides galvanic isolation between a control panel and power stage. Coreless transformer solutions offer a considerably lower level of power dissipation as compared to solutions involving core based transformers.

Figure 5:
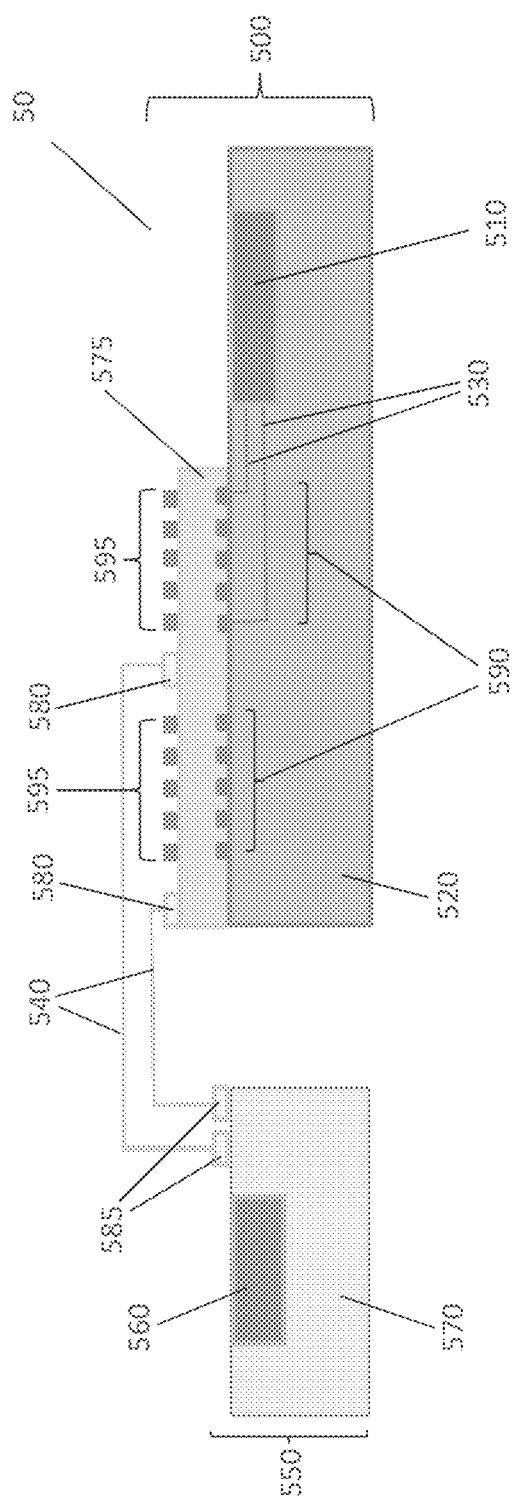
FIG. 5 illustrates a cross-sectional view of a core-less transformer.

FIG. 5 shows a simplified schematic cross-sectional view of a coreless transformer 50. A first integrated circuit 500 disposed in/on a semiconductor substrate 520 comprises a receiver 510, a primary inductor coil 590 and a secondary inductor coil 595. The two inductor coils 590/595 are separated by an insulating dielectric layer 575. A second integrated circuit 550 comprises a transmitter 560 disposed in/on a second semiconductor substrate 570. End terminals of the primary coil 590 are electrically connected to the receiver 510 by interconnect traces 530 and end terminals of the secondary coil 595 are electrically connected to the transmitter 560.

Figure 6C:
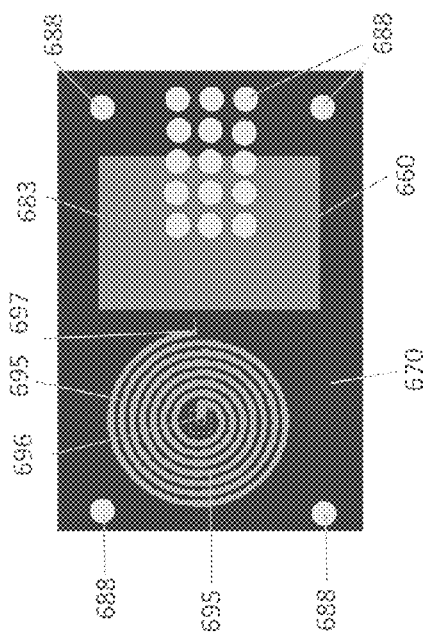
Figure 6E:
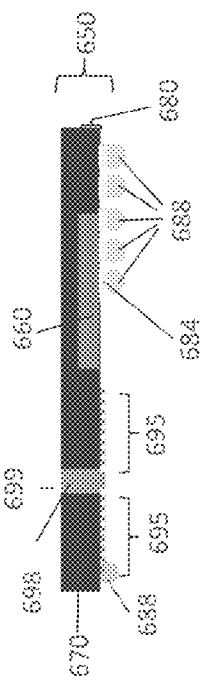
Figure 6D:
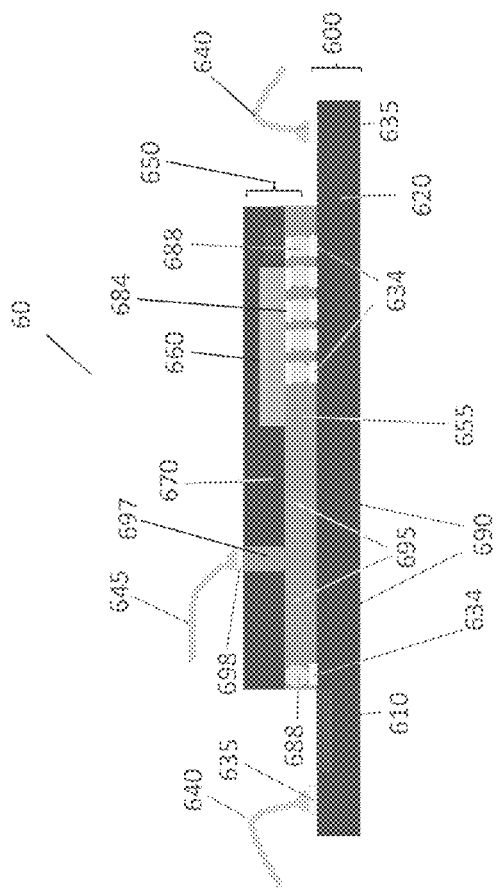

FIG. 6e show an embodiment of an integrated system 60. In one embodiment the integrated system is a coreless transformer having a schematic arrangement as described with respect to FIG. 5. In this embodiment the coil axis direction is orthogonal to the direction of main surfaces of the mother package and the daughter package. FIGS. 6a and 6b show a cross sectional view and a top view of a mother package 600, and FIGS. 6c and 6d show a cross sectional view and a top view of a daughter package 650. The coreless transformer 60 may comprise a chip embedding technology based first packaged component 600 and a chip embedding technology based second packaged component 650.

The first packaged component 600 comprises a first component 610, an encapsulation 620, windings of a first inductor coil 690, and a first redistribution layer (RDL) 630 disposed on a first main surface of the first packaged component 600. The windings 690 may be spiral shaped or may comprise other geometrical forms. The windings 690 may be disposed on the RDL 630 or may be part of the RDL 630.

The RDL 630 further comprises landing pads 635 which are configured to be wire connected or clip connected, and landing pads 634 which are configured to be solder ball connected. The end terminals 691, 692 of the first winding 690 may be directly connected to the first component 610 or may be connected via the interconnection trace 633 of the RDL 630 to a landing pad 634, 635. The first winding 690 may be entirely disposed over the first component 610, partially disposed over the first component 610 or disposed away from the first component 610, e.g., disposed only on the fan out area of the first packaged component 600. The first winding 690 may comprise a conductive material such as a polysilicon or a metal. For example, the first winding may comprise aluminum or copper.

The second packaged component 650 comprises a second component 660, a second encapsulation 670 a second winding of an inductor coil 695, and a second RDL 680. The windings 695 may be spiral shaped or may comprise other geometrical forms. The second winding 695 may be disposed on the RDL 680 or may be part of the RDL 680. The first winding 690 and the second winding 695 may comprise the same geometrical form.

The first component 610 and the second component 660 may be a transmitter or a receiver, respectively. The first component 610 and the second component 660 may be a transmitter or a receiver integrated in one of the components discussed with respect to FIG. 2.

The RDL 680 further comprises landing pads 684 and solder balls 688 or other connection elements disposed thereon. The end terminals 696, 697 of the second winding 695 may be directly connected to the second component 660 or may be connected via the interconnection trace 633 of the RDL 630 to a landing pad 684. The second winding 695 may be entirely disposed over the second component 660, partially disposed over the second component 660 or disposed away from the first component 660, e.g., disposed only on the fan out area of the second packaged component 650. The second winding 695 may comprise a conductive material such as a polysilicon or a metal. For example, the first winding may comprise aluminum or copper.

In one embodiment a conductive path 698 may lead from the inner end terminal 696 of the second winding 695 on the first main surface of the second packaged component 650 to a landing pad 699 on the second main surface of the package 650. The conductive path 698 may comprises a metal (e.g. Al or Cu) filled through-hole. The landing pad 699 may be configured to be attached to a wire bond 645.

The coreless transformer 60 may eliminate or mitigate the deleterious impact of parasitic capacitances due to the presence of an underlying component (semiconductor substrate) because the windings of the inductor coils 690/695 may be patterned over low-loss materials. The coils 690/695 may be structured, for example, over fan-out regions comprising low-loss encapsulation materials 620/670. Alternatively the coils 690/695 may be patterned over a low-loss barrier layer deposed over the upper main surface of the first/second component 610/660 (or over the whole upper main surface of the first/second packaged component 600/650).

A good dielectric material in vicinity of a transformer coil may exhibit a low dissipation factor and the low dielectric constant. Organic materials, among them molding compounds, are highly suitable material choices for that purpose. Their dielectric constants may be lower than that of silicon, with values in the range of about 2 to about 4.5 measured at 1 MHz frequency. For example, suitable materials are epoxy resins, polyimides, poly styrene or Teflon. Dissipation factors (DF) of organic materials may be very low too. DF values of about 0.003 to about 0.005 have been measured, for example, for epoxy compounds (at 1 MHz). The DF of poly ethylene, for example, is ≤0.0002, and the DF of poly styrene is ≤0.0001. The dielectric strength, indicating the maximum allowable field strength at which break-down of an insulating material will not yet occur, is in the range of about 100 kV/cm to 300 kV/cm for most plastic materials.

FIG. 6e shows an insulation layer 665 between the carrier package 600 and the second packaged component 650. The insulation layer 665, which may be deposited over the structured coil wires (690 or 695, or both) prior to the attachment of the overlying second packaged component 650, may comprise a high dielectric strength to alleviate the danger of dielectric discharges. Another option to mitigate the possibility of an electric discharge is to paste appropriately sized platelets comprising organic or inorganic (e.g., ceramics) compounds of high dielectric strength over the transformer coil(s). The dielectric strength may be about 9 or more.

In one embodiment the integrated system 60 may be a core-based transformer. The core based transformer 60 may comprise a magnetic film or a layer of magnetic paste in the gap between the windings of the primary coil 690 and the secondary coil 695. The magnetic flux may be enhanced by the magnetic film.

An advantage of the non-monolithic approach may be the avoidance of a detrimental impact of semiconductor substrate induced parasitic capacitances by employing non-silicon substrates such as prepreg laminates. The chip embedding technology/chip embedding technology stack approach of the embodiment of the invention furnishes significantly shorter interconnection paths, thereby delivering improved electrical performance. For example, transformer characteristics and power consumption are superior to conventional systems. The disclosed eWLB/eWLB approach shares an advantage in manufacturing costs inherent to any eWLB technology application because the extra costs for manufacturing reconstituted wafers are smaller than the considerable savings derived from the capability to minimize the die size for components without fan-out area, allowing to place a larger number of dies on more costly silicon wafers.

FIGS. 7a-7d shows another embodiment of an integrated system. The integrated system may be a coreless transformer. In this embodiment the coil axis direction is parallel to the direction of main surfaces of the mother package (first packaged component 700) and the daughter package (second packaged component 750). In one embodiment the coreless transformer comprises intertwined coil wirings. For example, the coreless transformer 70 comprises core wirings with a double helix of two intertwined coil wirings.

Figure 7C:
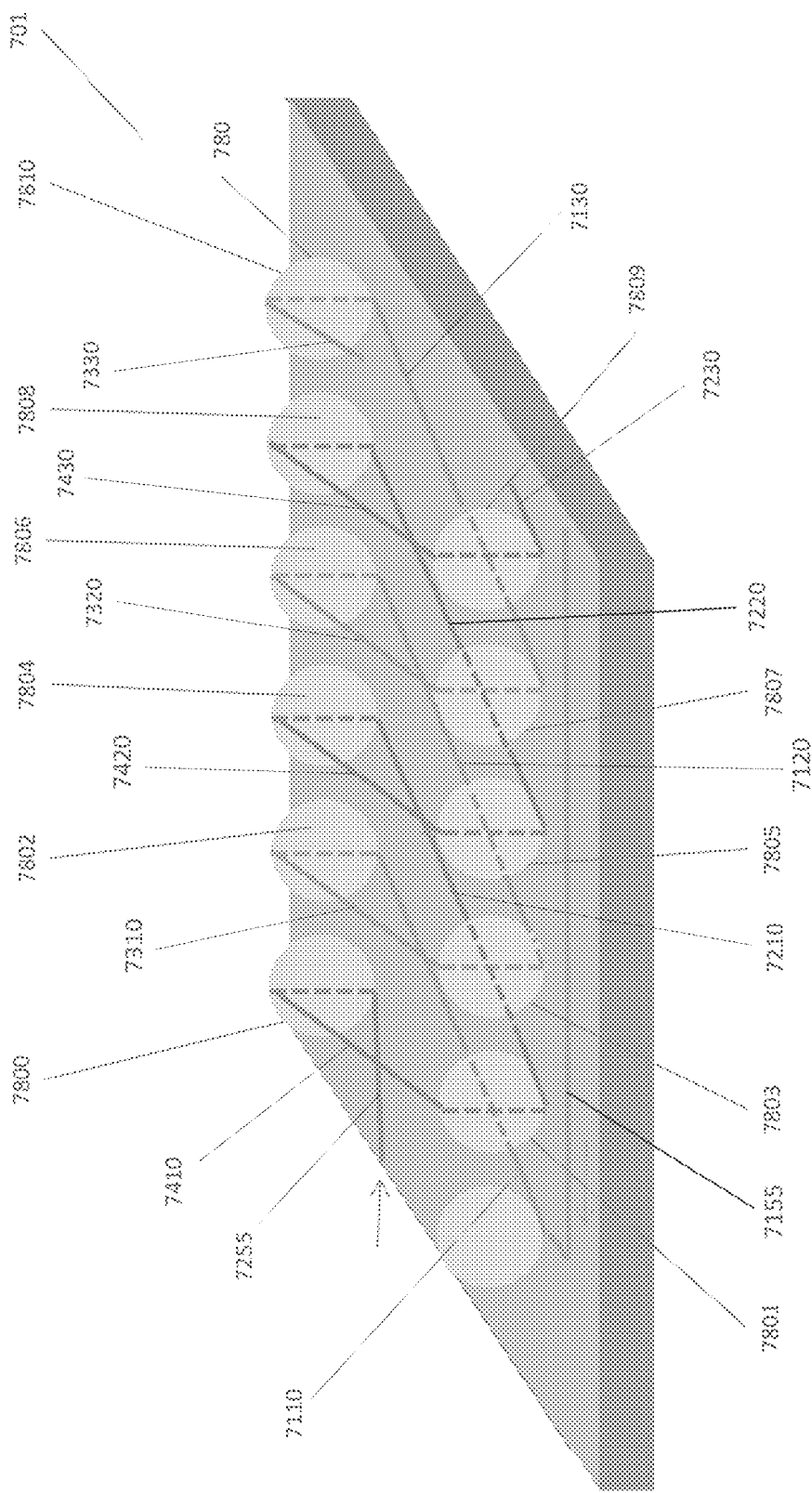
Figure 7D:
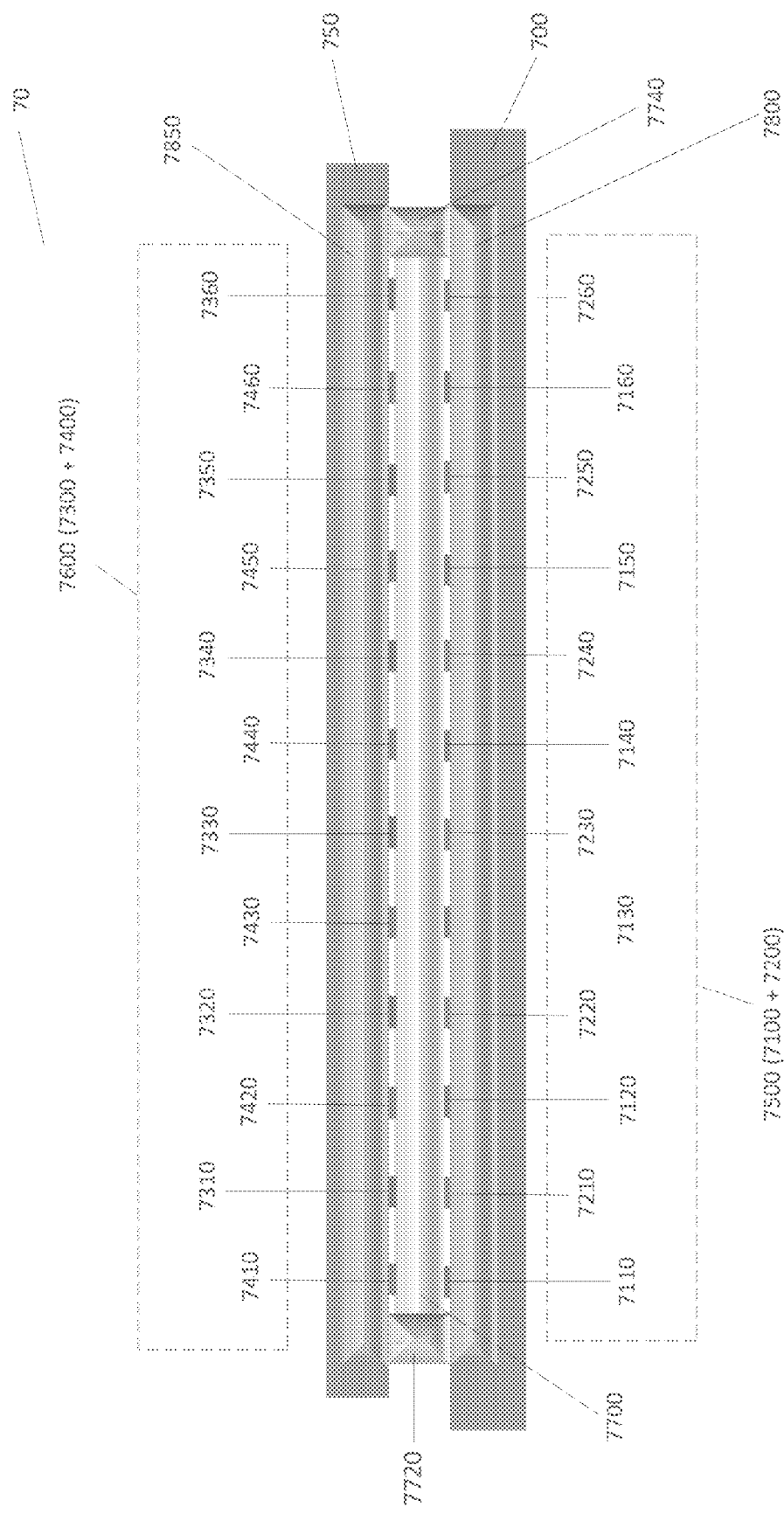

FIG. 7a shows the first packaged component 700, FIG. 7b shows the second packaged component 750, and FIG. 7c shows a solder ball arrangement between the first component 700 and the second component 750. FIG. 7d shows a cross-section of the core based transformer.

FIG. 7a shows a first packaged component 700 comprises a first component 710 (e.g., a transmitter and receiver) embedded in a first encapsulation 720. The first package component 700 comprises a first portion of a first transformer coil 7100 and a first portion of a second transformer coil 7200. The first portion of the first transformer coil 7100 comprises a first plurality of first transformer coil formation elements (CFE) 7110, 7120, 7130, 7140, 7150, and 7160. Each CFE comprises a conductive trace ending in bond pads 7111, 7112, 7121, 7122, 7131, 7132, 7141, 7142, 7151, 7152, 7161, 7162 and 7171. The first portion of the second transformer coil 7200 comprises a first plurality of second transformer coil formation elements (CFE) 7210, 7220, 7230, 7240, 7250, and 7260. Each CFE comprises a conductive trace ending in bond pads 7202, 7211, 7212, 7221, 7222, 7231, 7232, 7241, 7242, 7251, 7252, 7261 and 7262. The material and the dimension of the first portion of the first transformer coil 7100 and the first portion of the second transformer coil 7200 may be substantially identical. The individual CFEs of the first and second multiplicity of CFEs 7100/7200 may be aligned in parallel side-by-side wherein the CFEs of the first portion of the first coil 7100 alternate with the CFEs of the first portion of the second coil 7200.

The CFEs are disposed in the first RDL or in the first encapsulation material 720.

The first packaged component 700 further comprises an interconnect 785 which connects a first end 7202 of the first portion of the second coil 7200 with a peripheral pad 734 and an interconnect 780 which connects a second end 7261 of the first portion of the second coil 7200 with another peripheral pad 732. In addition the first packaged component 700 comprises an interconnect 790 connecting a first end 7111 of the first portion of the first coil 7100 to a peripheral pad 742, and a conductive trace connecting a second end 7171 of the first portion of the first coil 7100 with another peripheral pad 744. The pads are configured to be connected to the first component 710 and an outside device. The interconnects 780, 785, 790, 795 may be disposed in a single or in a plurality of layers of a first RDL.

FIG. 7b shows a second packaged component 750 comprises a second component 760 (e.g. a transmitter or receiver) embedded in a second encapsulation 770. The second package component 750 comprises a second portion of a first transformer coil 7300 and a second portion of a second transformer coil 7400. The second portion of the first transformer coil 7300 comprises a second plurality of first transformer coil formation elements (CFE) 7310, 7320, 7330, 7340, 7350, and 7360. Each CFE comprises a conductive trace ending in bond pads 7302, 7311, 7312, 7321, 7322, 7331, 7332, 7341, 7342, 7351, 7352, 7361 and 7362. The second portion of the second transformer coil 7400 comprises a second plurality of coil formation elements (CFE) 7410, 7420, 7430, 7440, 7450, 7460. Each CFE comprises a conductive trace ending in bond pads 7411, 7412, 7421, 7422, 7431, 7432, 7441, 7442, 7451, 7452, 7461, 7462 and 7471. Material and dimensions of the second portions of the first transformer coil 7300 and the second portions of the second transformer coil 7400 may be substantially identical. The individual CFEs of the first and second multiplicity of CFEs 7300/7400 may be aligned in parallel side-by-side wherein the CFEs of the second portion of the first coil 7300 alternate with the CFEs of the second portion of the second coil 7400.

The CFEs are disposed in a second RDL or in the second encapsulation material 770. The first component 710 and the second component 760 may be a transmitter or a receiver, respectively. The first component 710 and the second component 760 may be a transmitter or a receiver integrated in one of the components discussed with respect to FIG. 2.

The pads of the first portions of the first and second transformer coils 7100, 7200 are disposed on a first main surface of the first packaged component 700. The pads may be arranged on the first component 710 and/or the first fan out area. Alternatively, the pads may be arranged on the first fan out area but not on the first component.

The pads of the second portions of the first and second transformer coils 7300, 7400 are disposed on a first main surface of the second packaged component 750. The pads may be arranged on the second component 760 and/or the second fan out area. Alternatively, the pads may be arranged on the second component 760 but not on the second fan out area.

FIG. 7c shows a solder ball arrangement 701 between the first packaged component 700 and the second component package 750. The solder ball arrangement 701 provides a double helix system integrated in to the transform 70. The solder ball arrangement 701 connects the first portion of the first transformer coil 7100 to the second portion of the first transformer coil 7300 and the first portion of the second transformer coil 7200 to the second portion of the second transformer col 7400. The solder balls 780 are disposed on the pads and the space between the solder balls is filled with an insulating material 770.

FIG. 7c illustrates a first wiring path 7155 of the first inductor coil and a second wiring path 7255 of the second inductor coil. The wiring path 7155 is a portion of the entire wiring path of the first coil. The wiring path 7155 goes through the solder ball 7802, CFE 7310, solder ball 7803, CFE 7120, solder ball 7806, CFE 7320, solder ball 7807, CFE 7130 and solder ball 7810. The second wiring path 7255 is a portion of the entire wiring path of the second coil. The wiring path 7255 goes through the solder ball 7800, CFE 7410, solder ball 7801, CFE 7210, solder ball 7804, CFE 7420, solder ball 7805, CFE 7220, solder ball 7808, CFE 7430, solder ball 7809 and CFE 7230.

FIGS. 7a-7c show a first coil and a second coil disposed in the coreless transformer the individual elements of the first plurality of CFEs 7100 and the second plurality of CFEs 7200 are arranged in an alternating manner, thereby enabling the formation of intertwined inductor coil windings. Alternatively, the first plurality of CFEs 7100 may be sequentially arranged and the second plurality of CFEs 7200 may be sequentially arranged such that the whole (undivided) first portion of the second coil 7200 is arranged after the whole first portion of the first coil 7200 along a common horizontal axis.

FIG. 7d shows a cross sectional view of an embodiment of a core based transformer. The core based transformer may comprise a core comprising magnetic materials in order to achieve better magnetic coupling and optimum concentration and containment of magnetic flux. Suitable magnetic elements may be prefabricated ferrite parts or layers of magnetic paste. Bulk ferrite parts may comprise various types of ferrite (e.g. pure ferrite, Ni—Zn ferrite, Mn—Ni ferrite, or Mg—Mn ferrite). Magnetic pastes may comprise milled magnetic powders of ferrites or magnetic nanoparticles (e.g. silica coated Co nanoparticles) mixed with organic binders (e.g. epoxy resins, or benzo cyclo butane).

The integrated device 70 of FIG. 7d shows a magnetic core 7700 between the first packaged component 700 and the second packaged component 750. The integrated device 70 shows the coil forming elements 7100, 7200, 7300, 7400 in both the first packaged component 700 and the second packaged component 750. In one embodiment a thin and oblong ferrite part 7700 is disposed between a lower layer 7500 (first RDL) comprising conductive traces of the first portions of the first and second coils 7100/7200 and an upper layer 7600 (second RDL) comprising conductive traces comprised in the second portions of the first and second coils 7300/7400.

The integrated device may comprise two T-shaped end portions 7720/7740 for improved magnetic flux control of the magnetic core. In one embodiment, a second ferrite part 7800 is located below layer 7500 while a third ferrite part 7850 is located above layer 7600. The presence of these three ferrite parts 7700, 7800, 7850 will provide a closed-loop magnetic flux. The incorporation of the second 7800 and third 7850 ferrite part into the integrated device 70 occurs in the early stages of chip embedding technology processing.

In one embodiment ferrite plates 7800/7850 are placed on the reconstitution wafer (taped carrier surface) in positions next to the electric components 710/760, all of them to be subsequently embedded in molding compound 720/770. The double-T shaped centrally positioned ferrite part 7700 is pick-and-placed over the first packaged component 700 (being still part of a reconstituted wafer) prior to the alignment and bonding of the overlying second packaged component 750.

In one embodiment the integrated device 70 comprises magnetic pastes. A first magnetic paste layer is disposed on the first reconstituted wafer prior to the formation of the first portions of the first and second coils 7100/7200. The realization of magnetic paste patterns may occur via screen printing, or via sputtering or spin-coating of a magnetic material followed by lithographic patterning/etching. In analog manner a second magnetic paste layer is processed on the second reconstituted wafers prior to the formation of the second portions of the first and the second coil 7300/7400. Prior to the bonding of the second packaged component 750 to the first packaged component 700 a centrally positioned third paste layer—equivalent to the first ferrite part 7700—is disposed over the first portions of the first and the second coils 7100/7200. Alternatively double-T shaped trough-like features may be patterned at appropriate positions at the top surface of the first packaged components 700, and these troughs may then be filled with magnetic paste.

Figure 8:
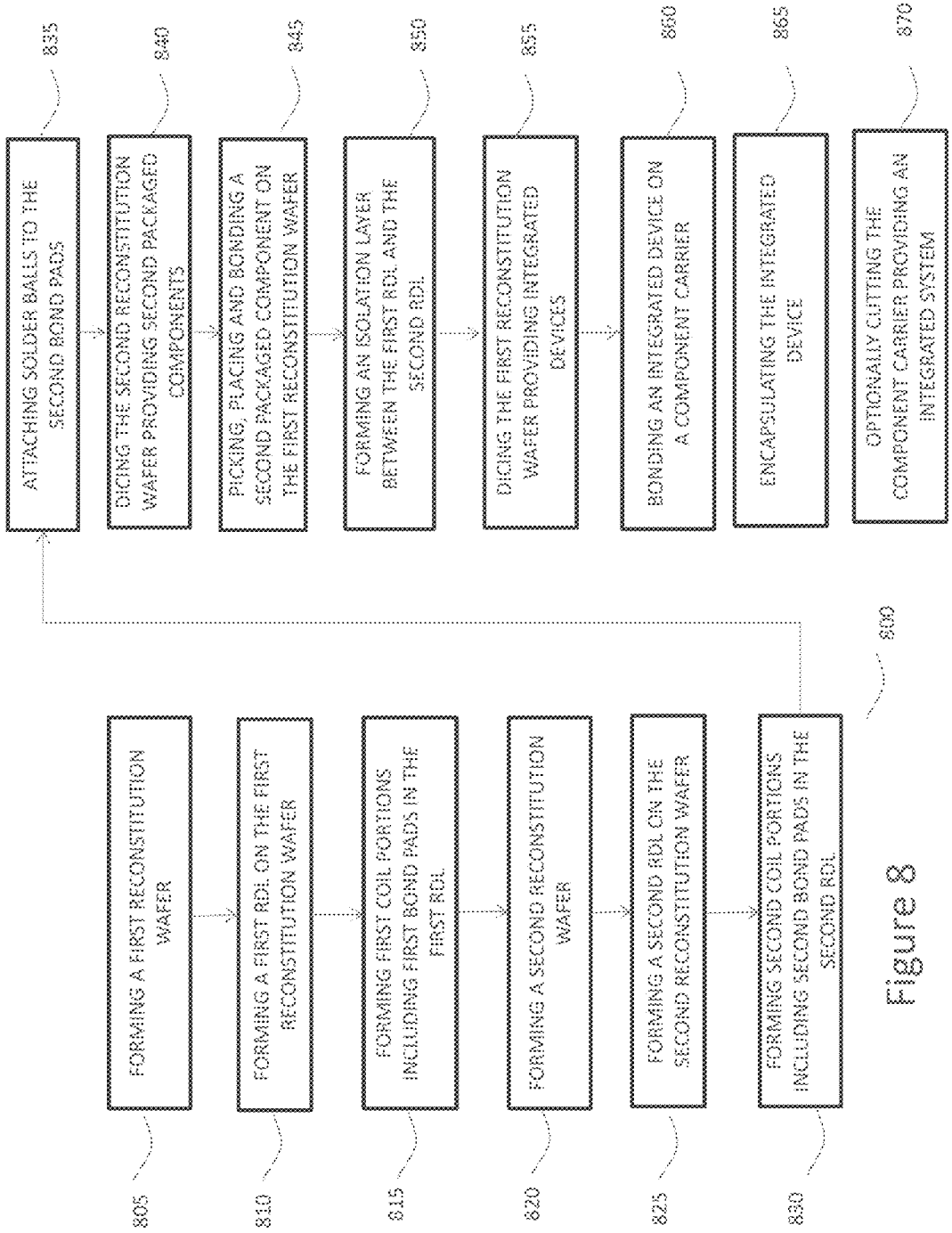
FIG. 8 shows a process flow of an embodiment of a method for manufacturing an integrated device.

FIG. 8 shows a flow chart 800 of an embodiment to manufacture a semiconductor system (e.g., eWLB/eWLB stack) comprising a transformer system. A first reconstitution wafer is manufactured using chip embedding technology. In a first step 805, the first reconstitution wafer is formed. The first reconstitution wafer comprises first components and a first encapsulation material as described with respect to FIGS. 1a and 1b.

In step 810, a first redistribution layer (RDL) is formed on the first reconstitution wafer. The first RDL may be formed by first depositing an insulating layer, patterning and etching the insulating layer, and then depositing a conductive material in the patterned insulation layer. The patterned conductive material in the RDL provides interconnect traces for connecting the first component with bond pads in fan out areas. The insulating material of the RDL may comprise polyimide, silicon nitride or silicon oxide or a combination thereof. The patterned conductive material of the RDL may comprise Cu or Al.

The first RDL may comprise portions of a transformer coil. The portion of a transformer coil may be a primary coil. Alternatively the portions of the transformer coil may be first portion of a first transformer coil and a first portion of a second transformer coil. The first portion of the first transformer coil and the first portion of the second transformer coil may comprise coil formation elements (CFEs). The portions of the transformer coil may or may not comprise bond pads. The first end terminal and a second end terminal of the portions of the transformer coil are connected via traces to first bond pads on/in the first RDL.

In step 815 the bond pads are prepared for solder application occurring at a later stage of the overall process sequence. The pad surfaces may be covered with a stack of thin metallic films of suitable composition providing optimum conditions for the formation of strong and reliable solder bonds. For example, a surface finish stack may comprise gold (Au) (e.g., about 0.5 μm to about 2 μm) on plated nickel (Ni) (e.g., about 2.5 μm to about 4 μm). The thin Au top layer may prevent oxidative degradation of Ni and preserves the solderability of Ni. Ni on the other hand facilitates the formation of intermetallics (e.g., Ni/Sn) to form strong metallurgical bonds.

In step 820, a second reconstitution wafer is formed. The second reconstitution wafer may be manufactured using a chip embedding technology. The second reconstitution wafer comprises second components and a second encapsulation material as described with respect to FIGS. 1a and 1b. The second component and the second encapsulation material may be the same or different than the first component and the first encapsulation material. In step 825, a second RDL is formed on the second reconstitution wafer. The second RDL may be formed by first depositing an insulating layer, patterning and etching the insulating layer, and then depositing a conductive material in the patterned insulation layer. The patterned conductive material in the second RDL provides interconnect traces for connecting the first component with bond pads in fan out areas. The insulating material of the second RDL may comprise polyimide, silicon nitride or silicon oxide or a combination thereof. The patterned conductive material of the second RDL may comprise Cu or Al. The materials of the second RDL may be the same or different than the materials of the first RDL. In one embodiment, an array of bond pads may be formed in the second RDL, the array of bond pads are configured to receive solder balls of a ball grid array (BGA).

The second RDL may comprise portions of a transformer coil. The portion of a transformer coil may be a secondary coil. Alternatively the portions of the transformer coil may be a second portion of a first transformer coil and a second portion of a second transformer coil. The second portion of the first transformer coil and the second portion of the second transformer coil may comprise coil formation elements (CFEs). The portions of the transformer coil may or may not comprise bond pads. The first end terminal and a second end terminal of the portions of the transformer coil are connected via traces to second bond pads in/on the second RDL.

In step 830, an under-bump metallization (UBM) layers may be deposited over the bond pads. The UBM metallurgy may provide good adhesion to the chip passivation layer surrounding the bond pads and may provide a low ohmic resistance to the final interconnect (solder ball) metallurgy. Several UBM material choices are available such as Al/Ni/Cu, electroless Ni/Au, Ni/Cu/Au, Cr/Cu/Ag or Ti/W/Cu. The total UBM process sequence involves RF Ar sputter cleaning of the pad surface, UBM sputter deposition, patterning of photoresist, etching of UBM in areas not covered by photoresist, etching of the UBM, and stripping of the resist to expose the UBM.

In step 835, solder balls may be attached to the second solder pads using a solder bumping process. Solder bumping process options include sputter deposition or electroplating of alloy components in an appropriate ratio, thermosonic bonding, or application of an ink jet process to dispense molten and pressurized solder material. Materials employed for solder ball formation may be eutectic Sn/Pb, or Pb-free Sn/Ag/Cu or Sn/Bi.

In the next step 840, the second reconstitution wafer is diced into a plurality of second packaged components. The second packaged components are picked & placed onto the first reconstitution wafer. Then the first reconstituted wafer and the second packaged components are bonded together (step 845). In one embodiment an insulating layer is disposed between the primary coil of the first reconstitution wafer and the secondary coil of the second packaged component (step 850). In one embodiment the CFEs of the first portion of the first transformer coil are connected (e.g., with solder material) to the CFEs of the second portion of the first transformer coil and the CFEs of the first portion of the second transformer coil are connected (e.g., with solder material) to the CFEs of the second portion of the second transformer coil. Surrounding the solder material an underfill material is disposed between the first reconstitution wafer and the second packaged components (step 850).

In one embodiment magnetic materials may be disposed between the first reconstitution wafer and the second packaged component. For example, magnetic pastes comprising nanoparticles may be used for high frequency devices. Small particle sizes and the separation distance between particles down to the nanoscale leads to novel magnetic coupling phenomena resulting in higher permeability and decreased magnetic anisotropy. At very high frequencies the permeability values of nanoparticle based magnetic pastes may be significantly higher than those of conventional (non-nanoscale) pastes and bulk ferrites.

In step 855 the first reconstitution wafer is diced forming integrated devices comprising a first component package with one or more second component packages disposed thereon.

In step 860 the integrated devices are placed on a component carrier. The component carrier may be a substrate, a lead frame or a board such as a printed circuit board (PCB).

The integrated devices are bonded to the component carrier. The integrated devices are bonded to the carrier applying a ball bonding process, a wedge bonding process, a strip bonding process, a ribbon bonding process or a combination of these processes. Alternatively, the integrated devices may be connected to the component carrier using a conductive clip.

In step 865 the integrated device is encapsulated and in step 870 the component carrier is optionally cut or separated. The encapsulation material may be the same as or different from the encapsulation materials discussed with respect to FIG. 2.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing an integrated device, the method comprising:
forming a first reconstitution wafer comprising first components;
forming a first redistribution line (RDL) layer on the first reconstitution wafer, the first RDL layer providing bonding pads for the first components;
forming first portions of primary windings and first portions of secondary windings in the first RDL;
forming a second reconstitution wafer comprising second components;
forming a second RDL layer on the second reconstitution wafer, the second RDL layer providing bonding pads for the second components;

forming second portions of the primary windings and second portions of the secondary windings in the second RDL dicing the second reconstitution wafer into second encapsulated components, the second encapsulated components comprising the second components, second RDL regions and second bonding pads;

placing the second encapsulated components on the first RDL layer of the first reconstitution wafer;

bonding the second bonding pads of the second encapsulated components to the bonding pads for the first components; and dicing the first reconstitution wafer into integrated devices, each integrated device comprising one of the first encapsulated components and one of the second encapsulated components.

2. The method of claim 1, wherein first encapsulated components comprise first fan-out areas having first bonding pads placed thereon, and wherein the second encapsulated components comprise second fan-out areas having the second bonding pads placed thereon.

3. The method of claim 1, further comprising:
electrically connecting the first portions of the primary windings with the second portions of the primary windings;
electrically connecting the first portions of the secondary windings with the second portions of the secondary windings; and
forming an insulation layer having a high dielectric strength between the second encapsulated components and the first reconstitution wafer.

4. The method of claim 3, further comprising forming a magnetic material between the second encapsulated components and the first reconstitution wafer.

* * * * *